United States Patent [19]

Ono et al.

[11] Patent Number: 4,974,200

[45] Date of Patent: Nov. 27, 1990

[54] METHOD OF TRANSFERRING BLOCH LINES IN THE DOMAIN WALL OF A MAGNETIC DOMAIN, AND A MAGNETIC MEMORY USING THE METHOD

[75] Inventors: Takeo Ono, Atsugi; Hitoshi Oda, Yokohama; Hisaaki Kawade, Atsugi; Akira Shinmi, Yokohama; Tokihiko Ogura, Fujisawa; Masao Sugata, Yokohama; Kuniji Osabe, Tama, all of Japan

[73] Assignee: Canon Kabushiki Kaisha, Tokyo, Japan

[21] Appl. No.: 78,845

[22] Filed: Jul. 28, 1987

[30] Foreign Application Priority Data

Jul. 30, 1986 [JP] Japan .................................. 61-177687
Jul. 30, 1986 [JP] Japan .................................. 61-177688
Jul. 30, 1986 [JP] Japan .................................. 61-177689
Jul. 30, 1986 [JP] Japan .................................. 61-177690

[51] Int. Cl.$^5$ .............................................. G11C 19/08
[52] U.S. Cl. ....................................... 365/29; 365/36; 365/37; 365/38; 365/42
[58] Field of Search ................ 365/29, 87, 36, 37, 365/38, 39, 42

[56] References Cited

U.S. PATENT DOCUMENTS

| | | | |
|---|---|---|---|
| 3,540,019 | 11/1970 | Bobeck et al. ...................... | 365/37 |
| 4,253,161 | 2/1981 | Paul et al. .............................. | 365/87 |
| 4,343,038 | 8/1982 | Enz ......................................... | 365/36 |
| 4,583,200 | 4/1986 | Konishi et al. ......................... | 365/29 |
| 4,589,094 | 5/1986 | Takeuchi et al. ....................... | 365/38 |

FOREIGN PATENT DOCUMENTS 98373 6/1984 Japan ....................................... 365/29

OTHER PUBLICATIONS

IEEE Transaction on Magnetics, Sep. 1972, pp. 405–407.

*Primary Examiner*—James W. Moffitt
*Attorney, Agent, or Firm*—Fitzpatrick, Cella, Harper & Scinto

[57] ABSTRACT

A method of transferring Bloch lines present in a domain wall of a magnetic domain formed in a thin magnetic firm, includes cyclically forming asymmetrical potential wells along the domain wall in order to locate the Bloch lines at predetermined positions of the domain wall, and applying a pulsed magnetic film to shift the Bloch lines from a predetermined potential well to another potential well. In a magnetic memory for recording information using Bloch lines as an information carrier, a memory substrate has a stripe magnetic domain defined by a domain wall along which asymmetrical potential wells are cyclically formed to stabilize the Bloch lines along the domain wall. The Bloch lines are written in the domain wall in accordance with input information, the Bloch lines so formed are read out, and the read-out Bloch lines are converted into an electrical signal. A pulsed magnetic field is applied in a direction perpendicular to a surface of the memory substrate for shifting the Bloch lines between potential wells.

14 Claims, 10 Drawing Sheets

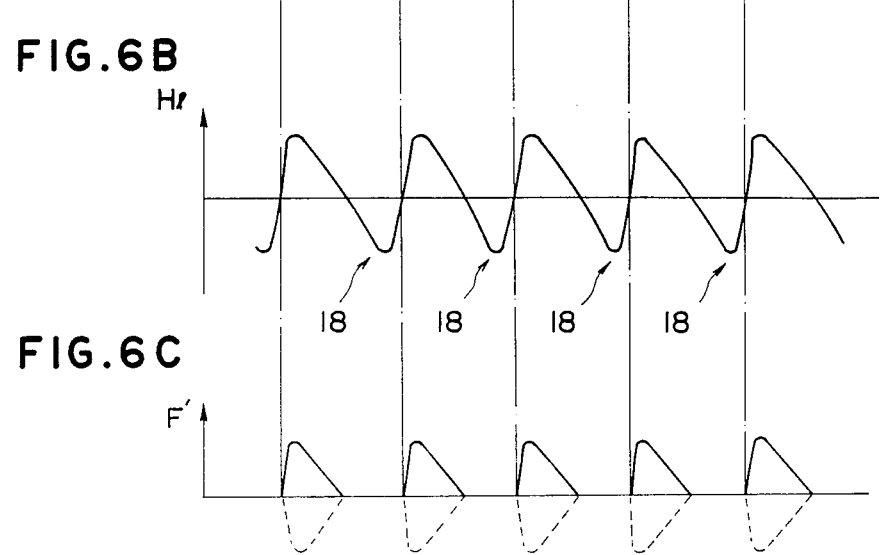

METHOD OF TRANSFERRING BLOCH LINES IN THE DOMAIN WALL OF A MAGNETIC DOMAIN, AND A MAGNETIC MEMORY USING THE METHOD

BACKGROUND OF THE INVENTION

1. Field of the Invention

The present invention relates to a method of transferring Bloch lines, the method being capable of being used in a magnetic memory for recording/reproducing information by using Bloch lines formed as a carrier of unit information in a domain wall of a stripe domain.

The present invention also relates to a magnetic memory for performing write/read access of information by transferring Bloch lines by a Bloch line transfer method different from a prior art method.

A magnetic memory of this type may be used as a versatile memory in a variety of applications for various electronic devices since information can be recorded at a very high density.

2. Related Background Art

Various devices such as magnetic tapes, Winchester disks, floppy disks, optical disks, optomagnetic disks, and magnetic bubble memories have been used as memories such as external computer memories, electronic file memories, and still image file memories. These memory devices, excluding the magnetic bubble memory, require movement of a write/read head relative to the memory when information is to be written or read. During relative movement of such a head, a data train can be permanently recorded in a data track, or the data train permanently written in the data track is read.

A higher recording density requires complicated tracking control for accurately-tracking the head along the data track. Imperfect control degrades the quality of the read/write signal. The quality of the read/write signal is also degraded by vibrations of a head carrier mechanism and dust or the like attached to the surface of the memory. In addition, in a memory device such as a magnetic tape wherein a head is brought into sliding contact with the surface of the magnetic tape to perform read/write access, wear of the memory device occurs. In a memory device such as an optical disk wherein read/write access is performed while a head is separated from the memory device, focusing control and tracking control are inevitable. If such control operations are not accurately performed, the quality of the read/write signal is undesirably degraded.

As described in U.S. Ser. No. 801,401 filed Nov. 25, 1985 (assigned to the same assignee as is the present invention), a magnetic bubble memory can record data at a predetermined position and can transfer data. In addition, data can be reproduced at a predetermined position while data is being transferred. Movement of the head relative to the memory is not required. Therefore, a magnetic bubble memory can achieve high operational reliability without problems posed by other memories when a recording density is to be increased.

In a magnetic bubble memory, however, a magnetic field is applied to a thin magnetic film (e.g., a magnetic garnet film) having an axis of easy magnetization in a direction perpendicular to the surface of the magnetic film to form a circular domain (i.e., a bubble), and the bubble so formed is used as a data bit. Even if a minimum size bubble (a diameter of 0.3 $\mu$m), whose size is limited by the material properties of the currently available garnet film, is used, the maximum recording density is several tens of Mbits/cm$^2$. A higher recording density cannot be expected.

A Bloch line memory see, (e.g., U.S. Pat. No. 4,583,200) has received a great deal of attention as a memory having a higher recording density than that of the above-mentioned magnetic bubble memory. A Bloch line recording/reproducing method is proposed in U.S. Ser. No. 800,770 filed Nov. 25, 1985. In the Bloch line memory, a Néel domain wall structure (Bloch line) pair sandwiched between the Bloch domain wall structures located around the domain formed by the thin magnetic film is used as a data bit. Therefore, the recording density of the Bloch line memory can be increased to about 100 times that of the magnetic bubble memory. For example, if a garnet film having a bubble diameter of 0.5 $\mu$m is used, the recording density can be as high as 1.6 Gbits/cm$^2$.

FIG. 1 is a perspective view showing a magnetic structure constituting a Bloch line memory described in the above U.S. patent.

Referring to FIG. 1, a thin magnetic garnet film 4 is formed on a nonmagnetic garnet substrate 2 made of GGG, NdGG or the like. The garnet film 4 can be formed by liquid-phase epitaxy (LPE) and has a thickness of about 5 $\mu$m. A stripe-like magnetic domain (to be referred to as a stripe domain hereinafter) 6 is formed in the thin magnetic garnet film 4. A domain wall 8 is formed as a boundary region of the stripe domain 6. The width of the stripe domain 6 is about 5 $\mu$m, and its length is about 100 $\mu$m. The thickness of the domain wall 8 is about 0.5 $\mu$m. As indicated by arrows A and B in FIG. 1, the direction of magnetization within the domain 6 is upward (arrow A); and the direction of magnetization outside the domain 6 is downward (arrow B).

The magnetization within the domain wall 8 is twisted from the inside to the outside (i.e., the plane on the side of the stripe domain 6), i.e., from the arrow A to the arrow B. The direction of twist inside Bloch lines 10 is opposite to that outside the Bloch lines in the domain wall 8. Referring to FIG. 1, the direction of magnetization at the central portion along the direction of thickness of the domain wall 8 is indicated by arrow C. The direction of magnetization of the Bloch lines 10 is indicated by arrow D.

An external downward bias magnetic field $H_B$ is applied by a permanent magnet or the like to the magnetic structure including the stripe domain 6.

As shown in FIG. 1, the Bloch lines 10 formed in the domain wall 8 include two kinds of lines having opposite directions of magnetization. Two such lines, one of each of the kinds of Bloch lines, constitute a Bloch line pair. The presence and absence of the Bloch line pair correspond to data "1" and data "0", respectively. The Bloch line pairs are regularly located in the domain wall 8. In other words, each Bloch line pair is located in one of a plurality of potential wells (to be described later). When a pulsed magnetic field having a direction perpendicular to the surface of the substrate is applied to the Bloch line, the Bloch line is continuously transferred to the next potential well. Recording (writing of the Bloch line pair in the domain wall 8) of information in the Bloch line memory and reproduction (readout of the Bloch line pair from the domain wall 8) of information from the Bloch line memory are performed at predetermined positions while the Bloch line pair is transferred within the domain wall 8. In the recording and reproduction modes, a pulsed magnetic field having a predetermined intensity and a direction perpendicular to the surface of the substrate can be applied to the predetermined positions. As is omitted from FIG. 1, pulse energization conductive patterns as a pulsed magnetic field applying means are formed on the surface of the thin magnetic film 4 at predetermined positions respectively corresponding to the stripe domains 6.

In the Bloch line memory described-above, the potential wells for the Bloch line pairs are constituted by forming regular Bloch line stabilizing patterns on the surface of the thin magnetic film so as to cross the domain wall.

FIG. 2 is a plan view of part of the Bloch line memory, showing the stabilizing patterns.

Referring to FIG. 2, a large number of parallel line conductive patterns 9 are formed on the surface of the thin magnetic film 4 so as to cross the stripe domain 6. The patterns 9 comprises conductive layers made of Cr, Al, Au, Ti, or the like. The width of each pattern 9 is about 0.5 μm, and the patterns 9 are aligned at pitches of about 1 μm. The patterns 9 are formed to generate magnetic distortion to form potential wells. When the patterns 9 are formed regularly, the alignment of the potential wells within the domain wall 8 can be regular and cyclic. Each pattern 9 may comprise a magnetic layer or a structure obtained by implanting ions (e.g., H, He, or Ne ions) near the surface of the thin magnetic film 4, in addition to the conductive layer described above. The potential wells formed by these patterns are symmetrical with respect to the Bloch line transfer direction.

As described in U.S. Pat. No. 4,583,200, Bloch line transfer can be performed as follows. A pulsed magnetic field having a direction perpendicular to the surface of the thin magnetic film 4 is applied thereto, and precession action of magnetization constituting the Bloch lines is utilized to shift the Bloch line to the adjacent potential well. However, when symmetrical potential wells are used and a magnetic field having simple rectangular pulses is used as the pulsed magnetic field, the Bloch lines cannot be stably shifted in a specific direction. For this reason, as shown in FIG. 3, the fall time of the Bloch line transfer pulsed magnetic field Hp is sufficiently longer than the rise time thereof, thereby preventing reversible transfer of the Bloch lines in the specific direction.

An electric circuit for generating the pulsed magnetic field is complicated. In addition, since the fall time is longer than the rise time, the transfer speed cannot be increased, resulting in inconvenience.

SUMMARY OF THE INVENTION

The present invention has been made in consideration of the above situation, and has as its object to provide a method of transferring Bloch lines, wherein a Bloch line transfer apparatus can be simplified and the Bloch line transfer speed can be increased.

It is another object of the present invention to provide a magnetic memory using a novel transfer method to transfer Bloch lines at high speed, thereby realizing high-speed recording or reproduction.

In order to achieve the above objects of the present invention according to an aspect of the present invention, there is provided a method of transferring Bloch lines formed in a domain wall of a domain formed in a thin magnetic film, comprising the steps of: cyclically forming asymmetrical potential wells along the domain wall, positioning the Bloch lines in the potential wells, and applying a pulsed magnetic field having a direction substantially perpendicular to a surface of the thin magnetic film.

According to another aspect of the present invention, there is provided a magnetic memory comprising: a memory substrate having cyclic asymmetrical potential wells along domain wall so as to stabilize Bloch lines in the domain wall of a stripe domain, means for writing the Bloch lines in the domain wall in accordance with input information, means for reading out the Bloch lines from the domain wall and converting the read-out Bloch lines into an electrical signal, and magnetic field generating means for applying a pulsed magnetic field having a direction perpendicular to a surface of the memory substrate and shifting the Bloch lines. The asymmetrical potential wells can be cyclically formed, along the domain wall of the domain as follows, using: a method in which asymmetrical magnetic patterns are cyclically formed on the thin magnetic film along the domain wall so as to cross the domain wall; a method in which asymmetrical three-dimensional patterns (relief patterns) are formed on the thin magnetic film along the domain wall; or a method in which regions having asymmetrical magnetic properties are cyclically formed in the thin magnetic film along the domain wall.

According to the present invention, Bloch lines are transferred between the asymmetrical potential wells, and the waveform of the pulsed magnetic field applied to the thin magnetic film during transfer can be a symmetrical pulse waveform. For this reason, the pulsed magnetic field generating means can be simplified, and Bloch line transfer speed can be increased.

These and other objects, features, and advantages of the present invention will become more fully apparent from the following detailed description of the preferred embodiments, taken in conjunction with the accompanying drawings.

BRIEF DESCRIPTION OF THE DRAWINGS

FIGS. 4A and 4B are views showing an embodiment of a Bloch line transfer method, in which FIG. 4A is a plan view showing part of a Bloch line memory for transferring Bloch lines according to the method of the present invention, and FIG. 4B is a sectional view thereof taken along the line B—B of FIG. 4A;

FIGS. 6A to 6C and FIGS. 7A to 7C are views for explaining magnetic properties in the domain wall in the Bloch line memory shown in FIG. 4A;

FIGS. 9A and 9B are views showing another embodiment of a Bloch line transfer method according to the present invention, in which FIG. 9A is a plan view showing part of a Bloch line memory for transferring the Bloch lines according to this method, and FIG. 9B is a sectional view thereof taken along the line B—B of FIG. 9A;

FIGS. 12A to 12C are views for explaining still another embodiment of a Bloch line transfer method according to the present invention, in which FIG. 12A is a plan view showing part of a Bloch line memory for transferring Bloch lines according to this method, FIG. 12B is a sectional view thereof taken along the line B—B of FIG. 12A, and FIG. 12C is a sectional view thereof taken along the line C—C of FIG. 12A;

DETAILED DESCRIPTION OF THE PREFERRED EMBODIMENTS

Figure 4A:
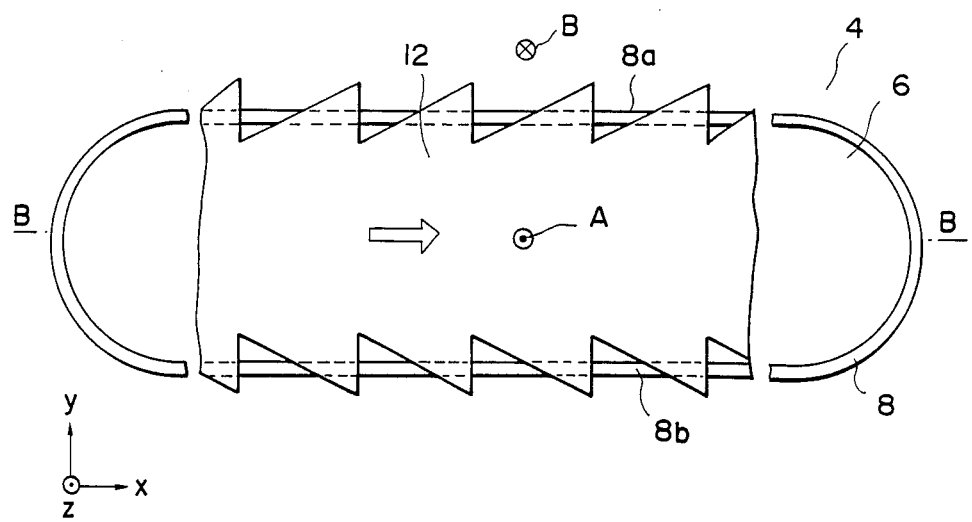
Figure 4B:
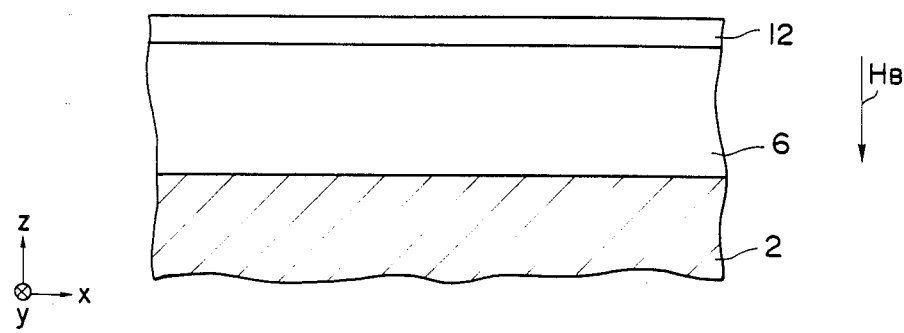

FIGS. 4A and 4B show an embodiment of a Bloch line transfer method according to the present invention. FIG. 4A is a plan view showing part of a Bloch line memory for transferring Bloch lines according to this transfer method, and FIG. 4B is a sectional view of the Bloch line memory taken along the line B—B of FIG. 4A.

In this embodiment, potential wells are formed by an application of a cyclic planar magnetic field having directivity along the domain wall and parallel to the surface of a thin magnetic film in which the magnetic domain is formed.

Referring to FIGS. 4A and 4B, a stripe domain 6 having a stripe-like planar shape is formed in a thin magnetic garnet film (to be referred to as a thin magnetic film hereinafter) 4. A domain wall 8 surrounds the stripe domain 6.

The direction of magnetization in the stripe domain 6 is upward (a direction of arrow A). The direction of magnetization in the thin magnetic film 4 portion excluding the stripe domain 6 is downward. An external downward bias magnetic field HB is applied to the thin magnetic film 4.

A ferromagnetic layer 12 is formed on the surface of the thin magnetic film 4 at a position substantially corresponding to the stripe domain 6. The ferromagnetic layer is a thin film made of CoPt or the like and has a thickness of about 0.1 μm. The ferromagnetic layer 12 has an axis of easy magnetization in the x direction and is magnetized to the right, i.e., in the planar direction of the thin magnetic film 4. As shown in FIG. 4A, both sides of the ferromagnetic layer 12 along the y direction have symmetrical saw-toothed patterns which partially overlap the domain wall 8 of the stripe domain 6. The teeth of the saw-toothed patterns of the ferro-magnetic layer 12 have pitches of, e.g., about 4 μm. The ferromagnetic layer 12 having such a planar shape can be formed by ion milling.

In this embodiment, as shown in FIG. 4A, the patterns of the ferromagnetic layer 12 which cyclically cross the domain wall 8 of the stripe domain 6 are asymmetrical along the direction of domain wall 8.

The effect of the asymmetrical patterns allows asymmetrical patterns of potential wells along the domain wall 8 (to be described later). As a matter of fact, the potential wells formed by the ferromagnetic layer 12 shown in FIG. 4A contribute to stabilization of the Bloch lines in the domain wall 8.

Figure 5A:
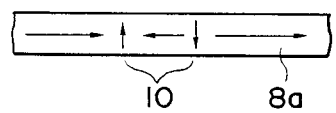
FIGS. 5A and 5B are schematic plan views showing Bloch line pairs in the domain wall portions of the Bloch lines shown in FIG. 4A.
Figure 5B:
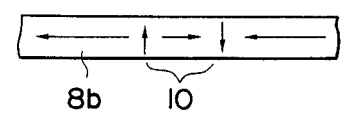

FIGS. 5A and 5B are schematic plan views showing Bloch line pairs in the domain wall 8 of the stripe domain 6 shown in FIG. 4A.

FIG. 5A shows a pair of Bloch lines 10 in a domain wall portion 8a (i.e., the upper portion of the domain wall 8 in FIG. 4A) and FIG. 5B shows another pair of Bloch lines 10 in a domain wall portion 8b (i.e., the lower portion of the domain wall in FIG. 4A). The magnetization in the domain wall portion 8a excluding the portion corresponding to the pair of Bloch lines 10 is directed to the right in FIG. 5A. The magnetization in the domain wall portion 8a corresponding to a portion between the Bloch lines 10 of the pair is directed to the left in FIG. 5A. As shown in FIG. 5B, the magnetization of the domain wall portion 8b excluding the portion corresponding to the pair of Bloch lines 10 is directed to the left in FIG. 5B. The magnetization in the domain wall portion 8b corresponding to a portion between the Bloch lines 10 of the pair is directed to the right in FIG. 5B.

FIGS. 6A to 6C and FIGS. 7A to 7C are views for explaining the magnetic properties in the domain wall 8 in this embodiment.

FIG. 6A is a plan view showing the domain wall portion 8a in the domain wall 8 of FIG. 4A. FIG. 6B is a graph showing a longitudinal magnetic component within the domain wall 8 corresponding to the portion shown in FIG. 6A when the right direction along the extension direction of the domain wall 8 is defined as a positive direction. FIG. 6C is a graph showing a distribution of forces required for movement of the pair of Bloch lines 10.

As shown in FIG. 6B, the ferromagnetic layer 12 shown in FIG. 4A is magnetized in the x direction. The side of the ferromagnetic layer 12 has an asymmetrical saw-toothed wave pattern having directivity on the magnetic wall portion 8a. Based upon these assumptions, a longitudinal magnetic component H1 along the x direction has a cyclic, asymmetrical saw-toothed wave pattern corresponding to the pattern of the corresponding side of the ferromagnetic layer 12. As shown in FIG. 5A, in the domain wall portion 8a of FIG. 4A, the direction of magnetization of the portion between the Bloch lines 10 of the pair is left. Therefore, the pair of Bloch lines 10 are stably located at a negative portion (indicated by reference numeral 18 in FIG. 6B) of the magnetic field H1, and this position is defined as a potential well as previously described.

In this embodiment, when a downward (direction of arrow B) pulsed magnetic field Hp is perpendicularly applied to the thin magnetic film 4 of FIG. 4A, the magnetization in the domain wall portion 8a is rotated clockwise (FIG. 5A) due to a gyromagnetic effect, and the pair of Bloch lines 10 are moved to the right along the domain wall portion 8a. It should be noted that the domain wall portion 8a is entirely moved downward in FIG. 4A. A driving force F generated by movement of the pair of Bloch lines 10 according to the gyromagnetic effect is defined as follows:

$$F = (4\pi/\gamma) M v_{wall}$$

where $\gamma$ is the gyromagnetic constant, M is the intensity of saturated magnetization of the domain wall 8, and $v_{wall}$ is the domain wall velocity. The domain wall velocity $v_{wall}$ can be defined as follows:

$$v_{wall} = \alpha \gamma \pi \cdot He$$

therefore, the magnitude of the driving force F is given by:

$$F = 4\pi\pi M\alpha \cdot He$$

where $\pi$ is the domain wall width parameter, $\alpha$ is the Gilbert's damping constant, and He is the effective magnetic field (including the pulsed magnetic field Hp and a change of demagnetizing field which is caused by domain wall movement) acting on the domain wall 8 of FIGS. 4A and 4B along the z direction.

Rotation of magnetization caused by the gyromagnetic effect is restricted on the basis of the presence of the longitudinal magnetic component Hl. The magnitude of a restriction force FR is defined as:

$$FR = 2\pi\pi M \cdot Hl$$

A driving force Fd for moving the Bloch line pair to the right in the domain wall portion 8a is derived from Fd = F − FR as follows:

$$\begin{aligned} Fd &= 4\pi\Pi M\alpha \cdot He - 2\pi\Pi M \cdot Hl \\ &= 2\pi\Pi M\alpha(2He - Hl/\alpha) \end{aligned}$$

Since the Gilbert's damping constant $\alpha$ is smaller than 1, the component Hl is very effective for control of Bloch line movement. At a positive position of the component Hl, an additional force is required to shift the pair of Bloch lines 10 as compared with a position where this longitudinal magnetic component is absent. If the additional force is defined as F', the force F' has a distribution shown in FIG. 6C. The force acting to the right is defined as a positive force in FIG. 6C. A driving force indicated by the solid line is required to shift the pair of Bloch lines 10 to the right. However, a driving force indicated by the broken line and having a polarity opposite to the force indicated by the solid line is required to shift the pair of Bloch lines 10 to the left.

Figure 7A:
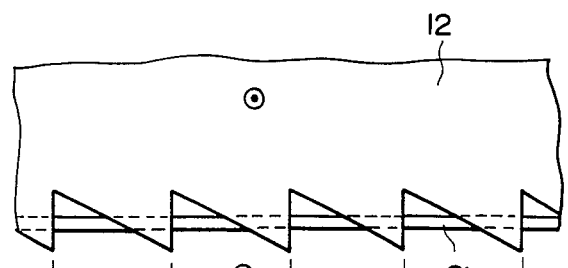
Figure 7B:
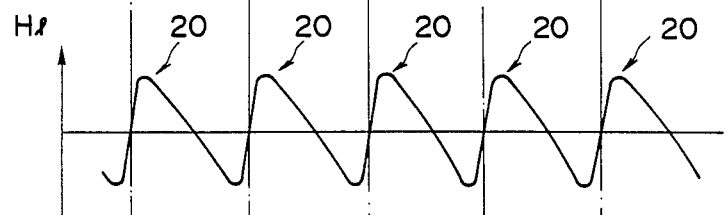
Figure 7C:
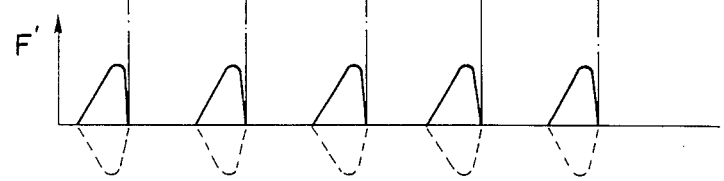

FIG. 7A is a plan view showing the domain wall portion 8b in the domain wall 8 shown in FIG. 4A, FIG. 7B is a graph showing a longitudinal magnetic component He within the domain wall 8 corresponding to FIG. 7 when the right direction along the domain wall direction is defined as a positive direction, and FIG. 7C is a graph showing forces required for shifting the pairs of Bloch lines 10. FIGS. 7A to 7C respectively correspond to FIGS. 6A to 6C.

A shown in FIG. 7B, the direction of magnetization of the domain wall portion between the two Bloch lines 10 of the pair in the domain wall portion 8b of FIG. 4A is right. The pair of Bloch lines 10 are stably located at the positive portion (indicated by reference numeral 20 in FIG. 7B) of the longitudinal magnetic component Hl. This positive portion is defined as the potential well.

Referring to FIG. 4A, when a downward (direction of arrow B) pulsed magnetic field Hp is perpendicularly applied to the thin magnetic film 4, the magnetization within the domain wall portion 8b is rotated clockwise (FIG. 5B) and the pair of Bloch lines 10 are moved to the right along the domain wall portion 8b in the same manner as described with reference to FIGS. 6A to 6C. It should be noted that the domain wall portion 8b as a whole is moved upward in the y direction.

At the negative position of the longitudinal magnetic component Hl in the domain wall portion 8b, an additional force is required to shift the pair of Bloch lines 10 as compared with a position where this longitudinal magnetic component is absent. If this force is defined as F', the force F' has a distribution, as shown in FIG. 7C. The force acting to the left is defined as a positive force in FIG. 7C. A driving force indicated by the solid line is required to shift the pair of Bloch lines 10 to the left. However, a driving force indicated by the broken line and having a polarity opposite to that indicated by the solid line is required to shift the pair of Bloch lines 10 to the right.

Figure 8A:
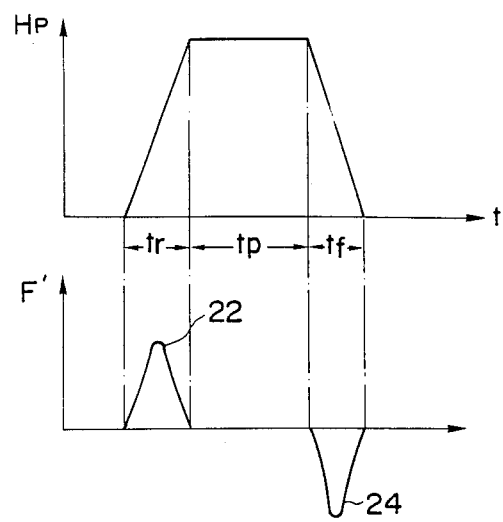
FIGS. 8A and 8B are views for explaining the relationship between a pulsed magnetic field Hp applied to transfer Bloch lines in the domain wall in the Bloch line memory of FIG. 4A, and a driving force F' for movement of the Bloch line pair formed by this pulsed magnetic field.
Figure 8B:

FIGS. 8A and 8B show the relationship between the pulsed magnetic field Hp and the driving force F' for shifting the pair of Bloch lines 10 upon an application of the pulsed magnetic field Hp.

FIG. 8A shows a magnetic field having substantially rectangular pulses whose rise and fall times tr and tf are equal to each other (e.g., rise time tr=50 nsec; peak time tp=100 nsec; and fall time tf=50 nsec). Based upon the fact that He is changed as a function of time upon an application of the pulsed magnetic field Hp, a positive force (FIG. 8B) represented by reference numeral 22 is generated during the rise time. A negative force (FIG. 8B) indicated by reference numeral 24 is generated during the fall time. Referring to FIG. 8B, the driving force 22 drives the pair of Bloch lines 10 to the right in the domain wall portion 8a of the domain wall 8 of FIG. 4A and the pair of Bloch lines 10 to the left in the domain wall portion 8b thereof. The driving force 24 drives the BLoch line pair to the left in the domain wall portion 8a and the Bloch line pair to the right in the domain wall portion 8b.

The waveform of the pulsed magnetic field Hp is determined such that a driving force having a peak value larger than that indicated by the solid line in FIGS. 6C and 7C is generated. During the rise time of the pulsed magnetic field Hp, the pair of Bloch lines 10 in the domain wall portion 8a are shifted to the right over the potential wall to the next potential well, and at the same time, the pair of Bloch lines 10 in the domain wall portion 8b are shifted to the left over the potential wall to the next potential well (FIGS. 6B and 7B). During the rise time of the pulsed magnetic field Hp, the pair of Bloch lines 10 in the domain wall portion 8a receive a left-direction force and the pair of Bloch lines 10 in the domain wall portion 8b receive the right-direction force by means of the driving force 24. In this case, the potential walls are long at positions where the pairs of Bloch lines 10 are to be shifted, and the driving force 24 disappears before the pairs of Bloch lines 10 are shifted over these potential walls. As a result, the pairs of Bloch lines 10 cannot be shifted to the corresponding adjacent potential wells (FIGS. 6B and 7B). As a result, each pair of Bloch lines is shifted to the next potential well in the right direction.

In the above embodiment, the cyclic three-dimensional patterns formed at both sides of the magnetic layer formed on the surface of the thin magnetic film are saw-toothed patterns. However, the three-dimensional patterns are not limited to these patterns, but may be constituted by any other shape having appropriate directivity or asymmetry.

According to the present invention, the ferromagnetic layer 12 may be formed in a region excluding the stripe domain 6. It is essential to form the cyclic asymmetrical pattern along the domain wall 8 so as to cross the domain wall 8 of the stripe domain 6, thereby generating asymmetrical potential wells shown in FIGS. 6B and 7B.

Figure 9A:
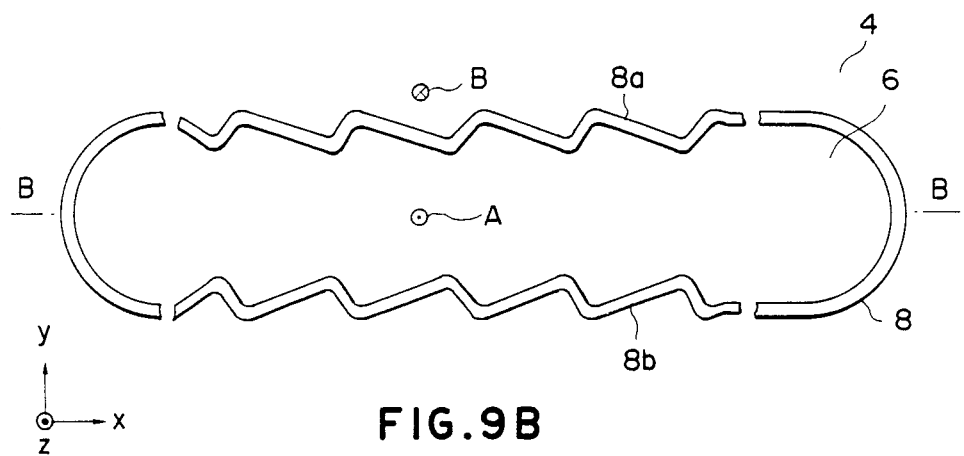
Figure 9B:
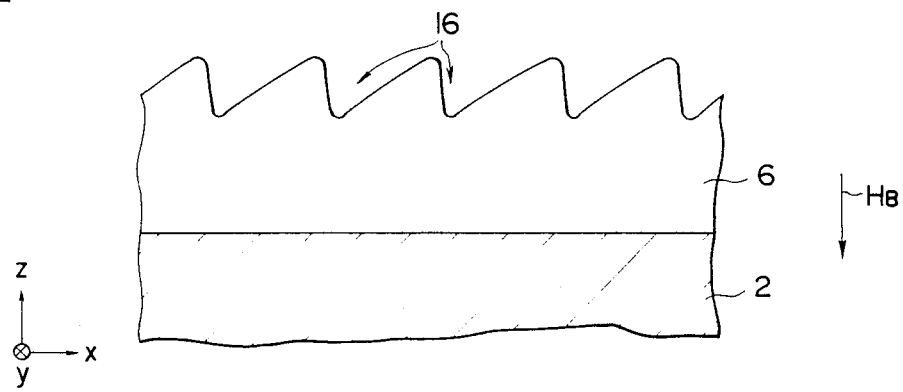

FIGS. 9A and 9B are views showing another embodiment of a Bloch line transfer method according to the present invention. FIGS. 9A is a plan view showing part of a Bloch line memory for transferring Bloch lines according to this transfer method, and FIG. 9B is a sectional view of the Bloch line memory taken along the line B—B of FIG. 9A.

The same reference numerals as in FIGS. 4A and 4B denote the same parts in FIGS. 9A and 9B, and a detailed description thereof will be omitted. Potential wells are formed upon an application of a cyclic longitudinal magnetic field so as to allow the potential wells to have directivity along the domain wall and to be parallel to the surface of a thin magnetic film 4 in the same manner as in the embodiment of FIGS. 4A and 4B.

Referring to FIGS. 9A and 9B, an external downward (direction of arrow B) bias magnetic field HB is applied the thin magnetic film 4. A large number of grooves 16 at predetermined pitches are formed on the surface of the thin magnetic film 4 so as to cross the domain wall 8 of the stripe domain 6. As shown in FIG. 9B, the sectional shape of the grooves 16 along the line B—B is a saw-toothed shape. The depth of each groove 16 is, e.g., about 2 $\mu$m, and the pitch of the adjacent grooves is, e.g., about 4 $\mu$m. These grooves 16 can be formed by ion milling.

As shown in FIG. 9A, planar shapes of opposite domain wall portions 8a and 8b of the stripe domain 6 are not straight but follow the zig-zag patterns having the same pitches as those of the grooves 16 shown in FIG. 9B. This is because a distribution is provided to the component along the direction of thickness (z direction) of a demagnetizing field on the basis of the three-dimensional pattern of the thin magnetic film 4. When the thickness of the thin magnetic film 4 is decreased, the domain wall 8 is so displaced as to widen the domain 6, thereby achieving a balanced state shown in FIG. 9A.

In this embodiment, the Bloch line pairs in the domain wall 8 are maintained in the same state as in FIGS. 5A and 5B.

FIGS. 10A to 10C and FIGS. 11A to 11C are views for explaining the magnetic properties of the domain wall 8 in this embodiment.

Figure 10A:
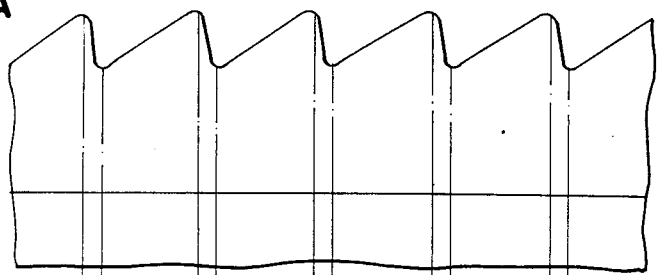
FIGS. 10A to 10C and FIGS. 11A to 11C are views for explaining magnetic properties in the domain wall of the Bloch line memory shown in FIG. 9A.
Figure 10B:
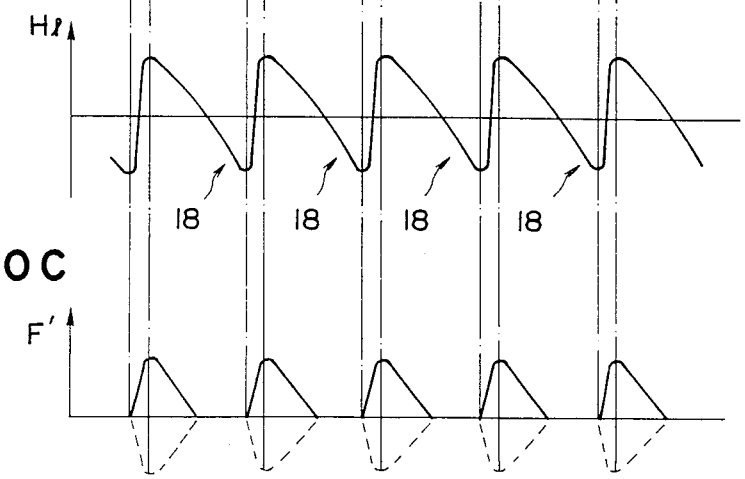
Figure 10C:
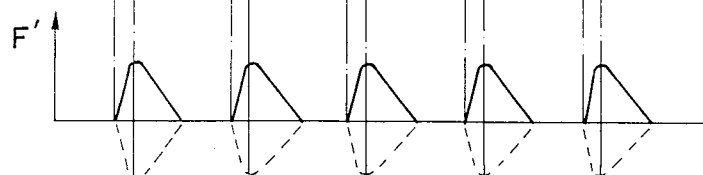

FIG. 10A shows a sectional shape of the domain wall along the domain wall portion 8a shown in FIG. 9A, FIG. 10B is a graph showing a longitudinal magnetic component at the position within the domain wall corresponding to the state of FIG. 10A when the right direction along the domain wall direction (x direction) is a positive direction, and FIG. 10C is a graph showing a distribution of forces required for shifting the Bloch line pair.

As shown in FIG. 10B, on the basis of the three-dimensional pattern of the surface of the thin magnetic film 4, a longitudinal magnetic component Hl along the x direction has a saw-toothed asymmetrical distribution having a cyclic pattern corresponding to the three-dimensional pattern on the surface of the thin magnetic film 4. As shown in FIG. 5A, the direction of magnetization between two Bloch lines 10 of the pair in the domain wall portion 8a is left, the pair of Bloch lines 10 are stably located at a negative portion (indicated by reference numeral 18 in FIG. 10B) of the longitudinal magnetic component Hl and the negative portion 18 in FIG. 10B serves as a potential well. It should be noted that the domain wall portion 8a of FIG. 9A is entirely moved in the y direction.

In the same manner as in the embodiment of FIGS. 4A and 4B, a driving force Fd for moving the Bloch line pair to the right in the domain wall portion 8a is derived as follows:

$$Fd = 2\pi\pi M\alpha(2He - Hl/\alpha)$$

Since the Gilbert's damping constant $\alpha$ is smaller than 1, the component Hl is very effective for control of Bloch line movement. At a positive position of the component Hl, an additional force is required to shift the pair of Bloch lines 10 as compared with a position where this longitudinal magnetic component is absent. If the additional force is defined as F', the force F' has a distribution shown in FIG. 10C. The force acting to the right is defined as a positive force in FIG. 10C. A driving force indicated by the solid line is required to shift the pair of Bloch lines 10 to the right. However, a driving force indicated by the broken line and having a polarity opposite to the force indicated by the solid line is required to shift the pair of Bloch lines 10 to the left.

Figure 11A:
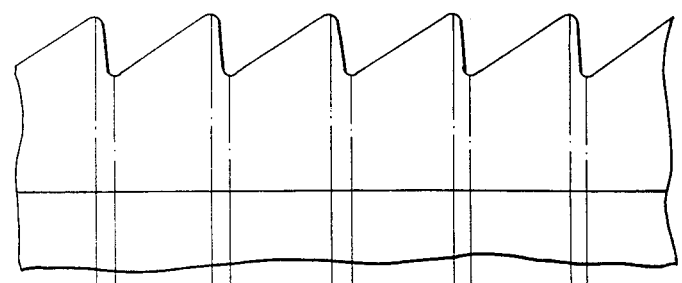
Figure 11B:
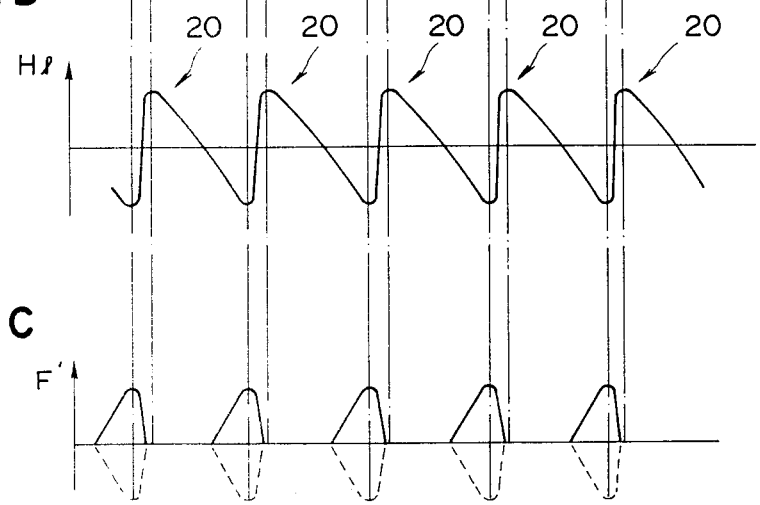
Figure 11C:
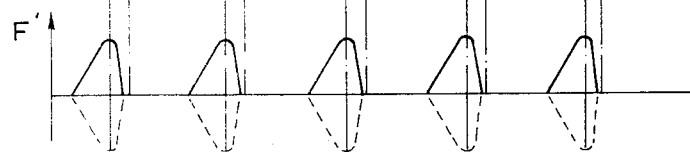

FIG. 11A is a plan view showing the domain wall portion 8b in the domain wall 8 shown in FIG. 9A, FIG. 11B is a graph showing a longitudinal magnetic component Hl within the domain wall 8 corresponding to FIG. 11A when the right direction along the domain wall direction (x direction) is defined as a positive direction, and FIG. 11C is a graph showing forces required for shifting the pairs of Bloch lines 10. FIGS. 11A to 11C respectively correspond to FIGS. 10A to 10C.

As shown in FIG. 5B, the direction of magnetization of the domain wall portion between the two Bloch lines 10 of the pair in the domain wall portion 8b is right. The pair of Bloch lines 10 are stably located at the positive portion (indicated by reference numeral 20 in FIG. 11B) of the longitudinal magnetic component Hl. This positive portion 20 in FIG. 11B is defined as the potential well.

When a downward pulsed magnetic field Hp is perpendicularly applied to the thin magnetic film 4, the magnetization within the domain wall portion 8b is rotated clockwise (FIG. 5B) and the pair of Bloch lines 10 are moved to the right along the domain wall portion 8b in the same manner as described with reference to FIGS. 10A to 10C. It should be noted that the domain wall portion 8b (FIG. 9A) as a whole is moved upward in the y direction.

At the negative position of the longitudinal magnetic component Hl in the domain wall portion 8b, an additional force is required to shift the pair of Bloch lines 10 as compared with a position where this longitudinal magnetic component is absent. If this force is defined as F', the force F' has a distribution, as shown in FIG. 11C. The force acting to the left is defined as a positive force in FIG. 11C. A driving force indicated by the solid line is required to shift the pair of Bloch lines 10 to the left. However, a driving force indicated by the broken line and having a polarity opposite to that indicated by the solid line is required to shift the pair of Bloch lines 10 to the right.

In this embodiment, the waveform of the pulsed magnetic field Hp and the driving force F' acting for shifting the Bloch line pair upon an application of the pulsed magnetic field Hp are the same as shown in FIGS. 8A and 8B.

Referring to FIGS. 8A and 8B, the driving force 22 drives the pair of Bloch lines 10 to the right in the domain wall portion 8a of the domain wall 8 of FIG. 9A and the pair of Bloch lines 10 to the left in the domain wall portion 8b thereof; and the driving force 24 drives the Bloch line pair to the left in the domain wall portion 8a and the Bloch line pair to the right in the domain wall portion 8b.

The waveform of the pulsed magnetic field Hp is determined such that a driving force having a peak value larger than that indicated by the solid line in FIGS. 10C and 11C is generated. During the rise time of the pulsed magnetic field Hp, the pair of Bloch lines 10 in the domain wall portion 8a are shifted to the right over the potential wall to the next potential well, and at the same time, the pair of Bloch lines 10 in the domain wall portion 8b are shifted to the left over the potential wall to the next potential well. During the rise time of the pulsed magnetic field Hp, the pair of Bloch lines 10 in the domain wall portion 8a receive a left-direction force and the pair of Bloch lines 10 in the domain wall portion 8b receive the right-direction force by means of the driving force 24. In this case, the potential walls are long at positions where the pairs of Bloch lines 10 are to be shifted, and the driving force 24 disappears before the pairs of Bloch lines 10 are shifted over these potential walls. As a result, the pairs of Bloch lines 10 cannot be shifted to the corresponding adjacent potential wells. As a result, each pair of Bloch lines 10 is shifted to the next potential well in the right direction.

Figure 12A:
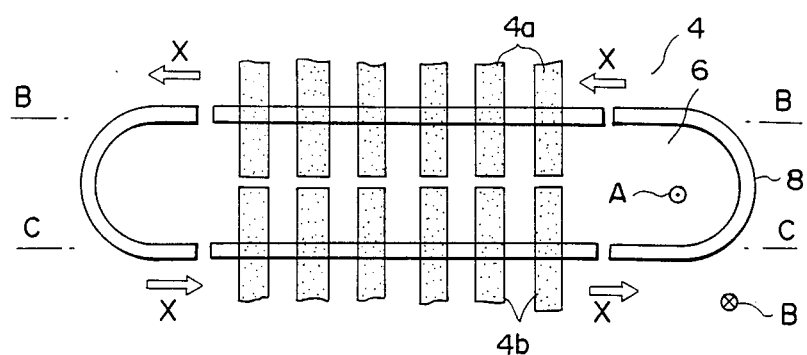
Figure 12B:
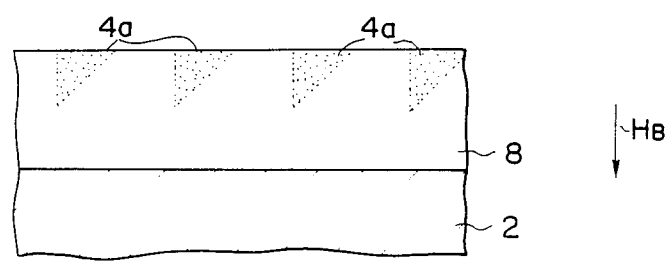
Figure 12C:
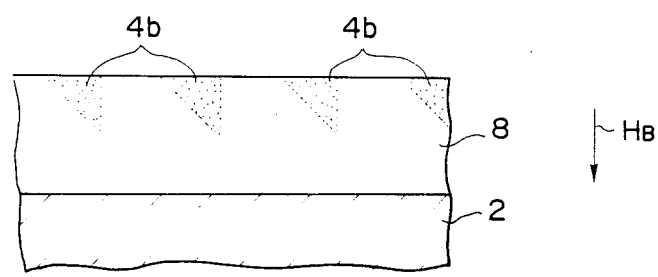

FIGS. 12A to 12C show still another embodiment of a Bloch line transfer method according to the present invention. FIG. 12A is a plan view showing part of a Bloch line memory for transferring Bloch lines according to the transfer method of this embodiment, and FIGS. 12B and 12C are respectively sectional views thereof taken along the lines B—B and C—C of FIG. 12A.

The same reference numerals as in FIGS. 4A and 4B denote the same parts in FIGS. 12A to 12C, and a detailed description thereof will be omitted. Potential wells with directivity along the domain wall are formed near the domain wall portion of the thin magnetic film.

Referring to FIGS. 12A to 12C, an external downward (direction of arrow B) bias magnetic field HB is applied to the Bloch line memory. Ion-implanted regions 4a and 4b having a saw-tooth sectional shape are formed near the surface of a thin magnetic film 4 so as to cross the domain wall 8. As shown in FIGS. 12B and 12C, the ion-implanted regions 4a and 4b have a distribution of depth which is continuously changed with respect to the direction (i.e., the B—B and C—C directions) of the domain wall 8. As shown in FIGS. 12B and 12C, the direction of magnetization of the ion-implanted region 4a is opposite to that of the ion-implanted region 4b. Ions to be implanted are ions having a relatively small radius, such as H, He, or Ne ions. The ions are implanted at acceleration energy of several keV to several tens of keV to form ion-implanted regions 4a and 4b having a maximum depth of about 3 μm near the surface of the thin magnetic film 4. The shape of the ion-implanted regions 4a and 4b may be a desired shape by using a proper mask, as shown in FIG. 12A. In this embodiment, the ion-implanted regions 4a and 4b have pitches of about 4 μm and a width of about 2 μm each. An ion implantation depth can be controlled such that ions are focused to form an ion beam and the ion beam is scanned and shifted while its energy is changed.

Figure 13A:
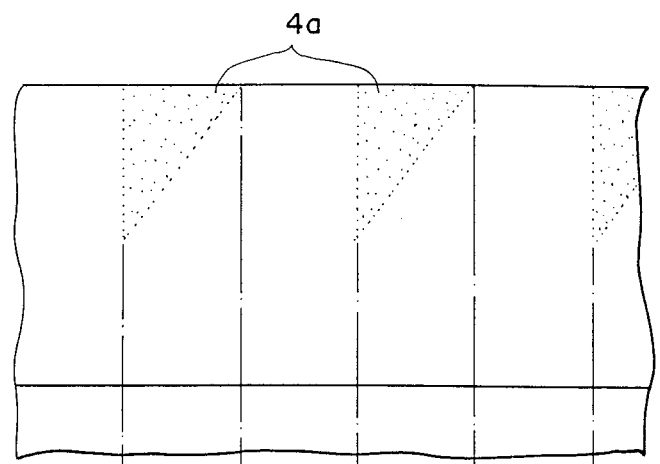
FIGS. 13A to 13C are views for explaining magnetic properties in the domain wall in the Bloch line memory of FIG. 12A.
Figure 13B:
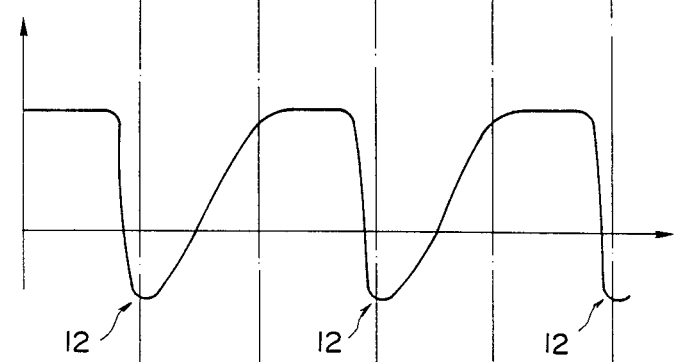
Figure 13C:
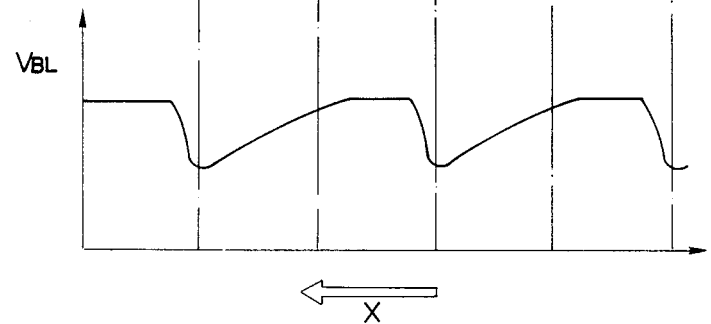

FIGS. 13A to 13C are views for explaining the magnetic properties in the domain wall 8 in this embodiment.

FIG. 13A is the same view as in FIG. 12B, FIG. 13B is a graph showing magnetic anisotropy at the domain wall position corresponding to FIG. 13A, and FIG. 13C shows a Bloch line velocity at the domain wall position corresponding to FIG. 13A.

As shown in FIG. 13B, in the ion-implanted region 4a and the position near the region 4a, magnetic properties are changed in correspondence with the ion implantation depth. Near the ion implantation edge (represented by reference numeral 121 in FIG. 13B) of the ion-implanted region 4a, the direction along the edge surface, i.e., the direction perpendicular to the domain wall 8 serves as the axis of easy magnetization by means of grating distortion symmetry. For this reason, the Bloch lines can be stably located, and this position serves as an asymmetrical potential well having directivity.

The Bloch line velocity upon an application of the pulsed magnetic field Hp in the direction (direction of arrow B) perpendicular to the surface of the thin magnetic film 4 of FIG. 12A is represented as follows:

$$v_{BL} = \gamma \cdot Hp \sqrt{A/2\pi Ms^2}$$

where $\gamma$ is the gyromagnetic constant, A is the exchange constant, and Ms is the saturated magnetization. It is known that the constant A is considerably reduced by ion implantation. The average value of the Bloch line velocities is calculated, as shown in FIG. 13C. Mobility of the Bloch lines has asymmetry. Mobility of the Bloch lines in the direction indicated by arrow X in FIGS. 13A and 13C is better than that in a direction opposite thereto.

When a vertical magnetic field Hp having substantially rectangular pulses (e.g., rise time tr=100 nsec; peak time tp=200 nsec; and fall time tf=100 nsec), as shown in FIG. 8A, is applied to the Bloch line memory, the Bloch lines can be moved in the direction of arrow X and shifted to the next stable position after the intensity of the pulsed magnetic field is properly set. Even after the pulsed magnetic field disappears, the Bloch lines are not returned to the previous stable positions in the reverse direction.

As shown in FIGS. 12A to 12C, the direction of magnetization of the ion-implanted region 4a is opposite to that of the ion-implanted region 4b. Upon an application of a single pulsed vertical magnetic field, the Bloch lines are shifted along the looped domain wall 8 which surrounds the stripe domain 6 in the direction of arrow X in FIG. 12A.

Directivity is assigned to the ion-implanted regions as the anisotropic magnetic regions according to the distribution of ion implantation depths in the above embodiment. However, directivity of the ion-implanted region may be assigned by an ion concentration distribution or the type of ion in the present invention.

Figure 14:
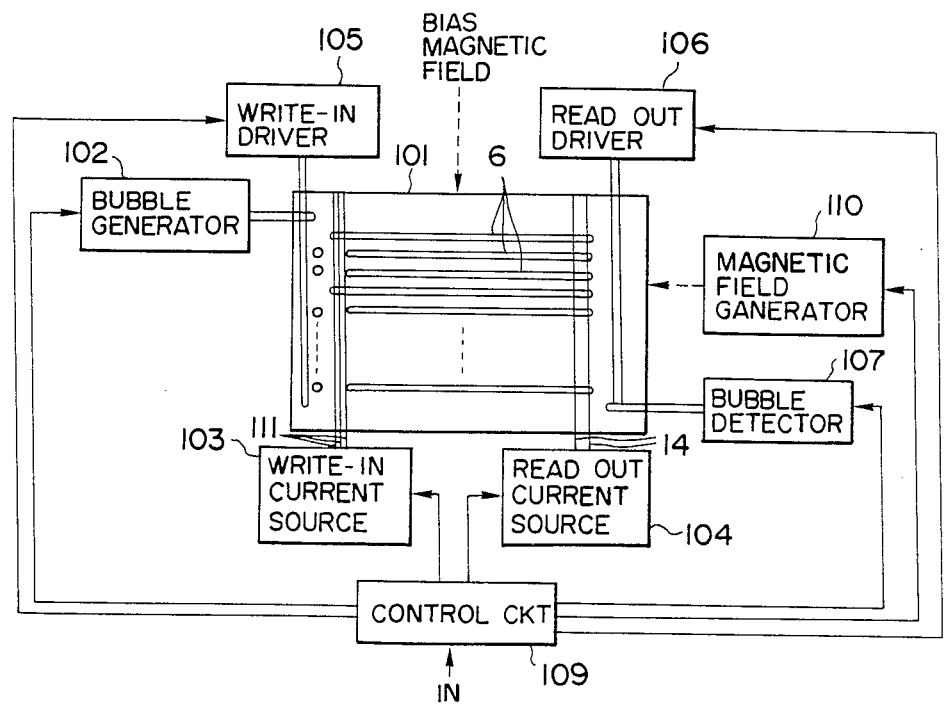
FIG. 14 is a schematic block diagram of a magnetic memory for recording/reproducing information using the transfer method of the present invention.

FIG. 14 is a schematic block diagram of a magnetic memory for transferring information by using the transfer method according to the present invention.

Referring to FIG. 14, a plurality of stripe domains 6 are formed on a Bloch line memory substrate 101. Information is stored in the form of a Bloch line arrangement in each domain wall of the stripe domain 6. A magnetic bubble generator 102 time-serially generates magnetic bubbles in accordance with input information. The magnetic bubble representing the information is transferred to the corresponding position of the stripe domain 6 by a write-in driver 105. A readout driver 106 converts the Bloch lines into a magnetic bubble in accordance with the same method as described in U.S. Pat. No. 4,583,200 and transfers a magnetic bubble to a bubble detector 107. The bubble detector 107 time-serially detects the magnetic bubble by utilizing a magentoresistive effect and converts the magnetic bubble into an electrical signal.

A readout current source 103 supplies a current to a write-in conductor 111 when the Bloch lines are written in the domain wall. A current source 104 supplies a current to a Bloch line readout conductor 14.

A bias magnetic field is applied to the Bloch line memory substrate 101 in a direction perpendicular to the surface thereof.

A pulsed vertical magnetic field generator 110 applies a pulsed magnetic field shown in FIG. 8A to the Bloch line memory substrate 101 and transfers the Bloch lines formed in the domain wall of the stripe domain 6. The generator 110 causes an orthogonal coil or the like to generate a magnetic field.

A control circuit 109 controls the drivers 105 and 106, the generators 102 and 110, the detector 107, and the sources 103 and 104.

In the magnetic memory shown in FIG. 14, the method of writing the Bloch lines to record information and the method of reading out the Bloch lines to reproduce information can be performed according to the methods described in U.S. Pat. No. 4,583,200.

In the magnetic memory shown in FIG. 14, asymmetrical potential wells are formed in the domain wall of the stripe domain 6 in the method described with reference to FIG. 4A, 9A, or 12A, and the Bloch lines are located at the most stable position in the potential well.

A magnetic field having symmetrial rectangular pulses shown in FIG. 8A is applied by the magnetic field generator 110, and the Bloch lines present in the respective potential wells are sequentially transferred to the next potential wells.

Figure 1:
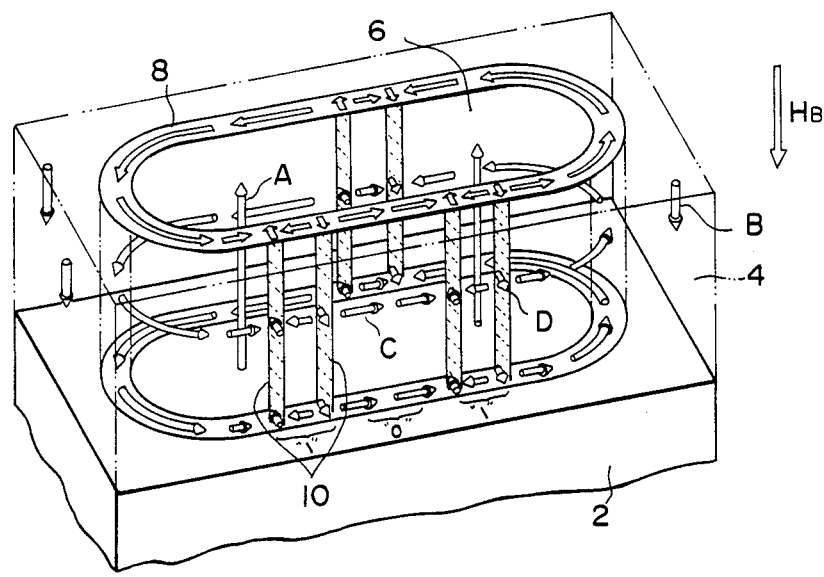
FIG. 1 is a perspective view showing a magnetic structure constituting a Bloch line memory.
Figure 2:
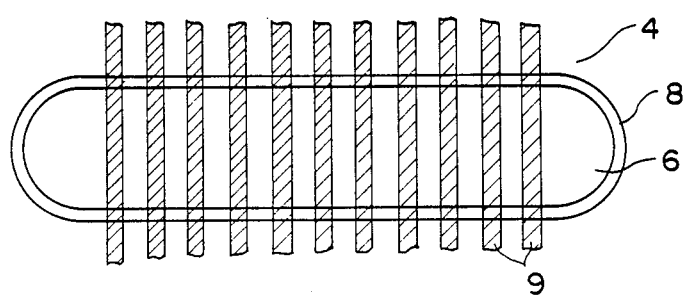
FIG. 2 is a view showing conventional Bloch line stabilizing patterns to explain a conventional method of forming potential wells for stabilizing Bloch line pairs.
Figure 3:
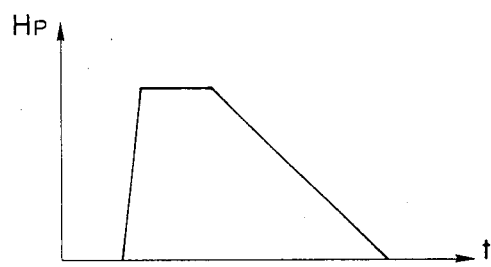
FIG. 3 is a chart showing a pulse waveform of a conventional pulsed vertical magnetic field for Bloch line transfer.

The circuit arrangement of the magnetic field generator 110 can be simplified since the complicated pulsed vertical magnetic field shown in FIG. 3 need not be used.

In addition, the fall time of the pulsed magnetic field can be shortened as compared with the conventional one, and the Bloch line transfer speed can be improved. The information transfer speed (bit rate) can be increased, thereby providing a magnetic memory for performing high-speed recording and reproduction.

The magnetic memory can employ a method of directly forming the Bloch lines in the magnetic wall and reading out them from the domain wall, in addition to the technique wherein read/write accessing of the Bloch lines is performed by conversion into the form of magnetic bubbles. An example of this modification is the optical method proposed in commonly assigned U.S. Ser. No. 800,770.

According to the present invention as described above, the Bloch lines can be properly transferred in a specific direction upon an application of a magnetic field having simple rectangular pulses to the Bloch line memory. Therefore, the electrical circuit for the Bloch line memory can be simplified. In addition, since the fall time of the pulsed magnetic field is short, the transfer speed can be increased to shorten the total access time. Furthermore, power consumption can be reduced. Therefore, a Bloch line memory can be realized with a simple arrangement so as to achieve stable, high-speed operation.

When the Bloch line transfer speed is increased, the processing speed of information recorded in the form of Bloch lines can be increased. The recording/reproducing speed of information can be increased. Therefore, a high-performance magnetic memory can be achieved.

What we claimed is:

1. A method of transferring Bloch lines present in a domain wall of a magnetic domain formed in a thin magnetic film, comprising the steps of:
   cyclically forming asymmetrical potential wells along the domain wall; and
   applying, to the thin magnetic film, a pulsed magnetic field, in a direction perpendicular to the surface of the magnetic film, to move the Bloch lines from a potential well to another of the potential wells.

2. A method according to claim 1, wherein the pulsed magnetic field has a substantially symmetrical waveshape.

3. A method according to claim 2, wherein said potential well forming step includes the step of forming an asymmetrical ferromagnetic pattern on the thin magnetic film so as to cyclically cross the domain wall.

4. A method according to claim 3, wherein the ferromagnetic pattern has a saw-toothed shaped in the surface of the thin magnetic film.

5. A method according to claim 2, wherein said potential well forming step includes the step of cyclically changing the domain wall in a zig-zag manner.

6. A method according to claim 5, wherein said step of changing the domain wall in the zig-zag manner includes the step of cyclically forming cyclic grooves on the surface of the thin magnetic film so as to cross the domain wall such that a cross section of the grooves is asymmetrical.

7. A method according to claim 6, wherein the cross section of the grooves has a saw-toothed shape.

8. A method according to claim 2, wherein said potential well forming step includes the step of implanting ions in the thin magnetic film.

9. A method according to claim 8, wherein said ion implanting step includes a step of providing an asymmetrical implantation distribution by changing depths of ion implantation along the domain wall.

10. A method according to claim 9, wherein said distribution has a saw-toothed shape in a cross section perpendicular to the surface of the thin magnetic film.

11. A method of transferring Bloch lines present in a domain wall of a magnetic domain formed in a thin magnetic film, comprising the steps of:
   cyclically forming asymmetrical potential wells along the domain wall; and
   applying a pulsed magnetic field having a substantially symmetrical waveform to the thin magnetic film, in a direction perpendicular to the surface of the magnetic film,
   said magnetic field applying step being performed in such manner as to move the Bloch lines between the potential wells.

12. A magnetic memory for recording information using Bloch lines as an information carrier comprising:

a memory substrate having a strip magnetic domain, said stripe magnetic domain being defined by a domain wall along which asymmetrical potential wells are cyclically formed to stabilize the Bloch lines;

means for writing the Bloch lines in said domain wall in accordance with input information;

means for reading out the Bloch lines formed in said domain wall and converting the read-out Bloch lines into information; and means for applying a pulsed magnetic field in a direction perpendicular to a surface of said memory substrate for transferring the Bloch lines between the potential wells.

13. A transferring apparatus for transferring a Bloch line pair present in a domain wall of a magnetic domain formed in a thin magnetic film, said apparatus comprising:

means for forming an asymmetrical potential well along the domain wall; and applying means for applying to the magnetic film a pulsed magnetic field, perpendicular to the magnetic film, to transfer the Bloch line pair along the domain wall.

14. An apparatus according to claim 13, wherein said applying means is structured and arranged such that the pulsed magnetic field has a substantially symmetrical wave shape and is applied to the magnetic film in a predetermined cycle.

* * * * *

UNITED STATES PATENT AND TRADEMARK OFFICE
CERTIFICATE OF CORRECTION

PATENT NO. : 4,974,200
DATED : November 27, 1990
INVENTOR(S) : TAKEO ONO, ET AL.

It is certified that error appears in the above-identified patent and that said Letters Patent is hereby corrected as shown below:

SHEET 10 OF 10

FIG. 14, "GANERATOR" should read --GENERATOR--.

COLUMN 1

Line 35, "accurately-tracking" should read --accurately tracking--.

COLUMN 2

Line 3, "see, (e.g.," should read --(see, e.g.,--.
    Line 8, "1985." should read --1985 (assigned to the same assignee as is the present invention).
    Line 53, "kinds" should read --two kinds--.

COLUMN 3

Line 9, "described-above" should read --described above--.
    Line 19, "comprises" should read --comprise--.

COLUMN 4

Line 17, "formed," should read --formed--.

COLUMN 5

Line 61, "ferro-magnetic" should read --ferromagnetic--.

COLUMN 7

Line 10, "$F=4\pi n M\alpha \cdot He$" should read --$F=4\pi \Pi M\alpha \cdot He$--.
    Line 23, "$FR=2\pi n M \cdot Hl$" should read --$FR=2\pi \Pi M \cdot Hl$--.

UNITED STATES PATENT AND TRADEMARK OFFICE
CERTIFICATE OF CORRECTION

PATENT NO. : 4,974,200
DATED : November 27, 1990
INVENTOR(S) : TAKEO ONO, ET AL.

Page 2 of 2

It is certified that error appears in the above-identified patent and that said Letters Patent is hereby corrected as shown below:

COLUMN 8

Line 35, "BLoch" should read --Bloch--.

COLUMN 10

Line 13, "Fd=2πnMα(2He-H1/α)" should read
　　　　　　--Fd=2πΠMα(2He-H1/α)--.

COLUMN 11

Line 68, Close up right margin.

COLUMN 12

Line 1, Close up left margin.
　　Line 17, "numeral 121" should read --numeral 12--.

Signed and Sealed this

Fifteenth Day of December, 1992

Attest:

DOUGLAS B. COMER

Attesting Officer　　　Acting Commissioner of Patents and Trademarks